United States Patent
Chen et al.

(10) Patent No.: US 9,018,069 B2
(45) Date of Patent: Apr. 28, 2015

(54) SEMICONDUCTOR STRUCTURE AND A METHOD FOR MANUFACTURING THE SAME

(71) Applicant: Macronix International Co., Ltd., Hsinchu (TW)

(72) Inventors: Chieh-Chih Chen, Hukou Shiang (TW); Cheng-Chi Lin, Toucheng Township, Yilan County (TW); Shih-Chin Lien, New Taipei (TW); Shyi-Yuan Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/021,120

(22) Filed: Sep. 9, 2013

(65) Prior Publication Data

US 2014/0024205 A1    Jan. 23, 2014

Related U.S. Application Data

(62) Division of application No. 13/185,948, filed on Jul. 19, 2011, now Pat. No. 8,564,099.

(51) Int. Cl.

| | |
|---|---|
| H01L 29/66 | (2006.01) |
| H01L 29/866 | (2006.01) |
| H01L 29/36 | (2006.01) |
| H01L 29/78 | (2006.01) |
| H01L 29/10 | (2006.01) |
| H01L 27/06 | (2006.01) |
| H01L 29/06 | (2006.01) |

(52) U.S. Cl.
CPC ........ H01L 29/66106 (2013.01); H01L 29/866 (2013.01); *H01L 29/7835* (2013.01); *H01L 29/1083* (2013.01); *H01L 27/0629* (2013.01); *H01L 29/36* (2013.01); *H01L 29/0646* (2013.01); *H01L 29/0649* (2013.01)

(58) Field of Classification Search
CPC . H01L 29/66106; H01L 29/36; H01L 29/866; H01L 29/0646
USPC ........... 438/328, 350; 257/E29.335, E21.356, 257/E27.051, E29.016, 355, 603, 362
See application file for complete search history.

(56) References Cited

U.S. PATENT DOCUMENTS

| | | | |
|---|---|---|---|
| 5,343,053 A * | 8/1994 | Avery | 257/173 |
| 5,528,064 A | 6/1996 | Thiel et al. | |
| 5,541,123 A * | 7/1996 | Williams et al. | 438/202 |
| 6,507,085 B2 * | 1/2003 | Shimizu | 257/502 |
| 2004/0000700 A1 | 1/2004 | Romas, Jr. et al. | |
| 2006/0208340 A1 | 9/2006 | Glenn et al. | |
| 2009/0045457 A1 | 2/2009 | Bobde | |

* cited by examiner

*Primary Examiner* — Roy Potter
*Assistant Examiner* — Paul Patton
(74) *Attorney, Agent, or Firm* — McClure, Qualey & Rodack, LLP

(57) ABSTRACT

A semiconductor structure and a method for manufacturing the same are provided. The semiconductor structure comprises a diode. The diode comprises a first doped region, a second doped region and a third doped region. The first doped region and the third doped region have a first conductivity type. The second doped region has a second conductivity type opposite to the first conductivity type. The second doped region and the third doped region are separated from each other by the first doped region. The third doped region has a first portion and a second portion adjacent to each other. The first portion and the second portion are respectively adjacent to and away from the second doped region. A dopant concentration of the first portion is bigger than a dopant concentration of the second portion.

11 Claims, 8 Drawing Sheets

US 9,018,069 B2

SEMICONDUCTOR STRUCTURE AND A METHOD FOR MANUFACTURING THE SAME

This application is a divisional application of U.S. patent application Ser. No. 13/185,948, filed Jul. 19, 2011, now U.S. Pat. No. 8,564,099, the content of which is incorporated herein by reference.

BACKGROUND

1. Technical Field

The disclosure relates in general to a semiconductor structure and a method for manufacturing the same, and more particularly to a diode and a method for manufacturing the same.

2. Description of the Related Art

A diode of a semiconductor structure is applied for an electronic circuit widely. The diode can be used for a voltage stabilizer and providing a stable voltage for circuit. Besides, the diode can also be used for protecting a circuit device of an IC device from damage due to an extreme high voltage. However, the conventional technique of the diode has some challenges. For example, the switching speed is too low to meet the demand for the IC device. The slow-speed switching leads to circuit failure easily. Therefore, the high-speed switching applications in the current circuit is the trend. However, a design area that the conventional diode need is big. It hinders a unit device from scaling down.

SUMMARY

A semiconductor structure is provided. The semiconductor structure comprises a diode. The diode comprises a first doped region, a second doped region and a third doped region. The first doped region and the third doped region have a first conductivity type. The second doped region has a second conductivity type opposite to the first conductivity type. The second doped region and the third doped region are separated from each other by the first doped region. The third doped region has a first portion and a second portion adjacent to each other. The first portion and the second portion are respectively adjacent to and away from the second doped region. A dopant concentration of the first portion is bigger than a dopant concentration of the second portion.

A method for manufacturing a semiconductor structure is provided. The method for manufacturing the semiconductor structure comprises forming a diode. A method for forming the diode comprising following steps. A second doped region is formed on a first doped region. A third doped region is formed on the first doped region. The first doped region and the third doped region have a first conductivity type. The second doped region has a second conductivity type opposite to the first conductivity type. The second doped region and the third doped region are separated from each other by the first doped region. The third doped region has a first portion and a second portion adjacent to each other. The first portion and the second portion are respectively adjacent to and away from the second doped region. A dopant concentration of the first portion is bigger than a dopant concentration of the second portion.

A semiconductor structure is provided. The semiconductor structure comprises a diode. The diode comprises a first doped region, a second doped region and a third doped region. The first doped region and the third doped region have a first conductivity type. The second doped region has a second conductivity type opposite to the first conductivity type. The second doped region and the third doped region are separated from each other by only the first doped region.

DETAILED DESCRIPTION

Figure 1:
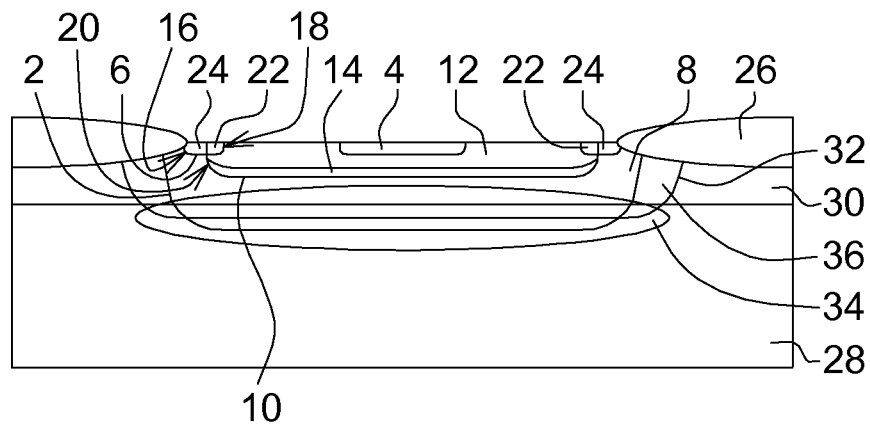
FIG. 1 illustrates a cross-section view of a semiconductor structure in one embodiment.
Figure 2:
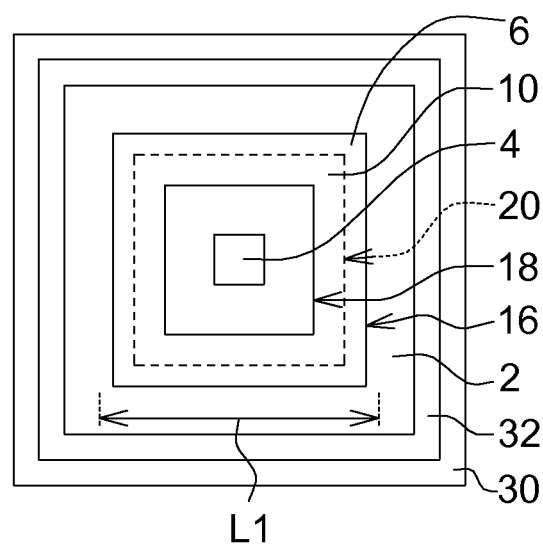
FIG. 2 illustrates a top view of a semiconductor structure in one embodiment.

FIG. 1 and FIG. 2 respectively illustrate a cross-section view and a top view of a semiconductor structure in one embodiment. FIG. 2 does not show a dielectric isolation structure 26 in FIG. 1. Referring to FIG. 1, the semiconductor structure comprises a diode. The diode comprises a first doped region 2, a second doped region 4 and a third doped region 6. The first doped region 2 comprises a well region 8 and a top layer 10. The top layer 10 is on the well region 8. The top layer 10 may have an edge 20 between opposite edges 16, 18 of the third doped region 6. The top layer 10 comprises a first sub-layer 12 and a second sub-layer 14. The first sub-layer 12 is on the second sub-layer 14. A dopant concentration of the first sub-layer 12 may be bigger than a dopant concentration of the second sub-layer 14. The third doped region 6 has a first portion 22 and a second portion 24 adjacent to each other. The first portion 22 and the second portion 24 are respectively adjacent to and away from the second doped region 4. A dopant concentration of the first portion 22 may be bigger than a dopant concentration of the second portion 24. In one embodiment, the third doped region 6, and the well region 8, the first sub-layer 12 and the second sub-layer 14 of the first doped region 2 have a first conductivity type such as P conductivity type. The second doped region 4 has a second conductivity type, such as N conductivity type, opposite to the first conductivity type. The second doped region 4 and the third doped region 6 may be heavily doped. In embodiments, the diode may be used as a Zener diode.

Referring to FIG. 1, the semiconductor structure may comprise a substrate 28, an epitaxial layer 30 and a doped isolation structure 32. The epitaxial layer 30 is formed on the substrate 28. The substrate 28 and the epitaxial layer 30 may have the first conductivity type such as P conductivity type. The doped isolation structure 32 may comprise a buried layer 34 and a well region 36. The buried layer 34 and the well region 36 may have the second conductivity type such as N conductivity type. The doped isolation structure 32 provides self-isolation for the diode. Therefore, the diode can be isolated from other devices.

Referring to FIG. 1, in one embodiment, the second doped region 4 and the third doped region 6 are separated from each other by only the top layer 10 of the first doped region 2. In other words, a dielectric isolation structure is not disposed between the second doped region 4 and the third doped region 6. Therefore, an area that the diode needs to occupy is small. In embodiments, an area that the diode without a dielectric isolation structure between the second doped region 4 and the third doped region 6 needs to occupy is smaller than an area that a diode having a dielectric isolation structure (such as a dielectric isolation structure 744 in FIG. 14) between the second doped region (such as a second doped region 704 in FIG. 14) and the third doped region (such as a third doped region 706 in FIG. 14. For example, for the diode without a dielectric isolation structure between the second doped region 4 and the third doped region 6, an active region (OD region) defined by the dielectric isolation structure 26 such as space of FOX has a small length L1 (FIG. 2) being 12.6 µm. However, a length of an active region of a diode with a dielectric isolation structure (such as the dielectric isolation structure 744 in FIG. 14) is 16.4 µm.

Figure 3:
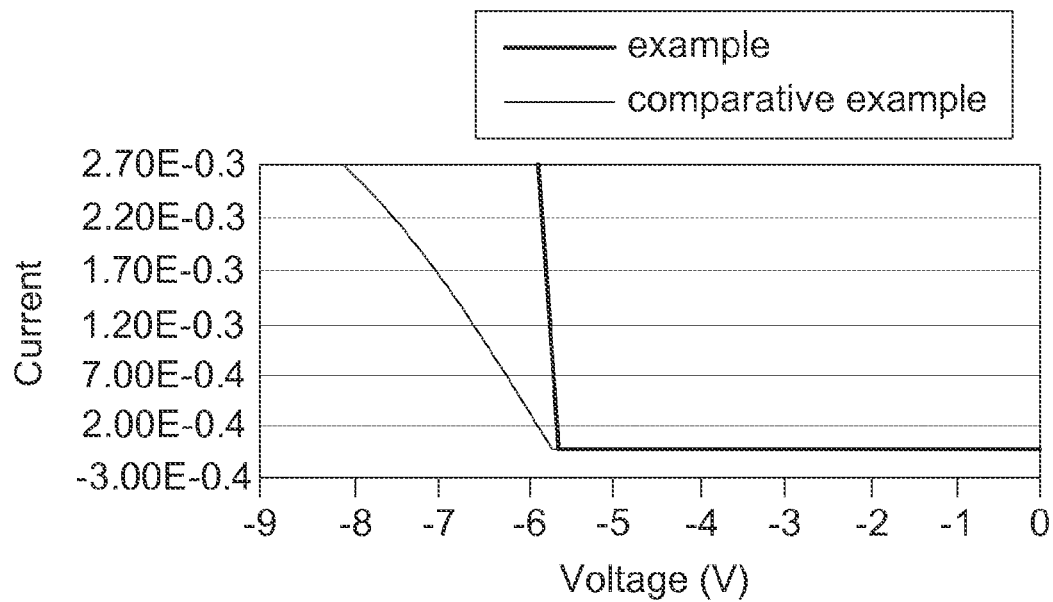
FIG. 3 illustrates I-V curves of a diode of embodiment and a diode of comparative example.

The diode having the top layer 10 as shown in FIG. 1 can has a low on-resistance. In addition, a switching speed of the diode can be improved by using the top layer 10 and omitting the dielectric isolation structure (such as the dielectric isolation structure 744 in FIG. 14) between the second doped region 4 and the third doped region 6. For example, as shown in FIG. 3, illustrating I-V curves of the diode of embodiment and the diode of comparative example, the switching speed of the diode of embodiment is higher than the switching speed of the diode of comparative example.

In embodiments, the semiconductor structure can be applied for mix-mode or analog circuit design, such as start up circuit or charge pump circuit.

Figure 4:
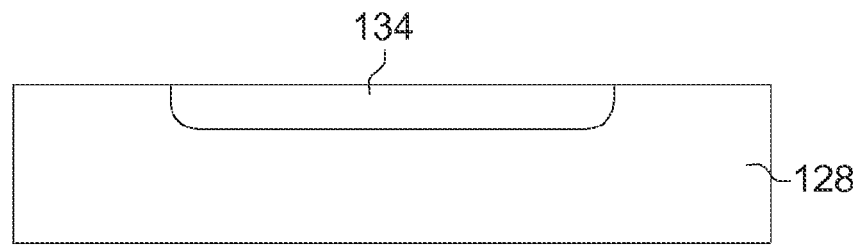
FIGS. 4-8 illustrate a process for manufacturing a semiconductor structure in one embodiment.

FIGS. 4-8 illustrate a process for manufacturing the semiconductor structure in one embodiment. Referring to FIG. 4, the buried layer 134 is formed on the substrate 128. The buried layer 134 may be formed by a doing step comprising using a mask layer. In detail, for example, the buried layer 134 may be formed by a method comprising forming a patterned mask layer (not shown) on the substrate 128, and then doping the substrate 128 exposed by the mask layer. After the buried layer 134 is formed, the mask layer is removed. In one embodiment, the buried layer 134 is formed by driving in the dopant by an annealing step.

Figure 5:
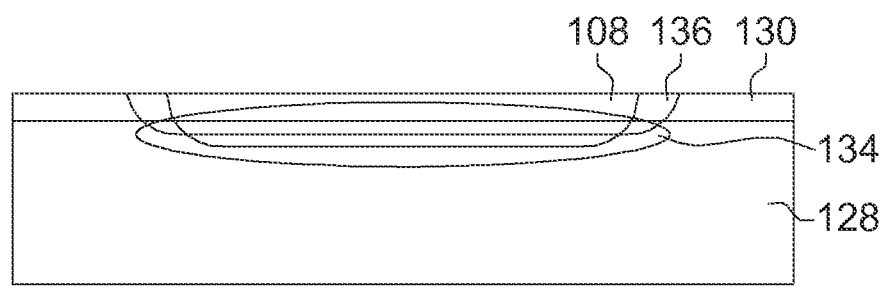

Referring to FIG. 5, the epitaxial layer 130 is formed on the substrate 128. In addition, for exmpale, the well region 136 is formed on the substrate 128, the epitaxial layer 130 and the buried layer 134. The well region 108 may be formed on the buried layer 134 and the well region 136. The well region 136 and the well region 108 respectively may be formed by a doing step comprising using a mask layer. In some embodiments, the well region 136 and the well region 108 may be formed by driving in the dopant by an annealing step.

Figure 6:
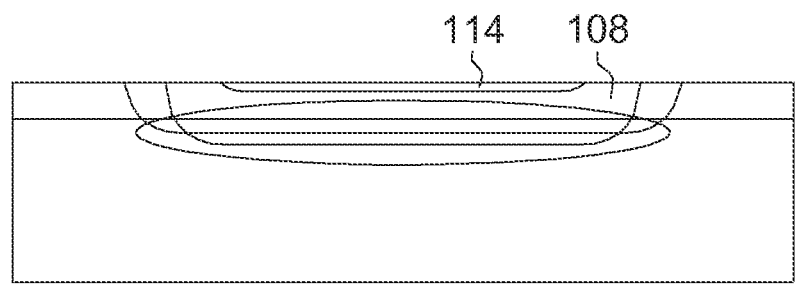
Figure 7:
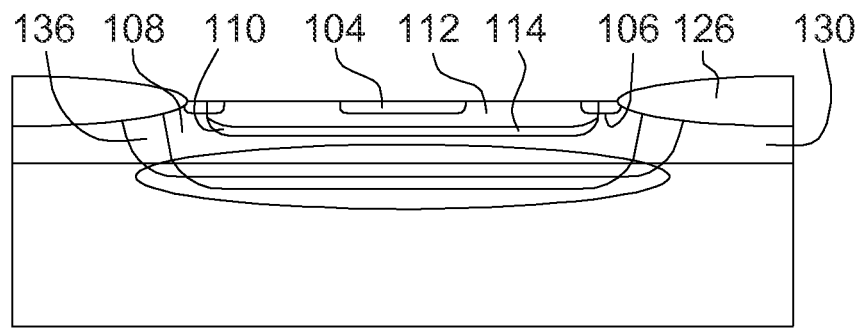

Referring to FIG. 6, the second sub-layer 114 is formed on the well region 108. The second sub-layer 114 may be formed by a doing step comprising using a mask layer. For example, the second sub-layer 114 is formed by doping a top portion of the well region 108. In some embodiments, the second sub-layer 114 as shown in FIG. 7 is formed by driving in the dopant by an annealing step. Referring to FIG. 7, for example, the dielectric isolation structure 126 is formed on the well region 108, the epitaxial layer 130 and the well region 136.

The first sub-layer 112 is formed on the second sub-layer 114. The second doped region 104 is formed on the first sub-layer 112. The third doped region 106 is formed on the well region 108 and the top layer 110 comprising the first sub-layer 112 and the second sub-layer 114. The first sub-layer 112, the second doped region 104 and the third doped region 106 may be respectively formed by a doing step comprising using a mask layer. A method for forming the third doped region 106 comprises doping a top portion of the top layer 110 and a top portion of the well region 108 adjoined with each other.

Figure 8:
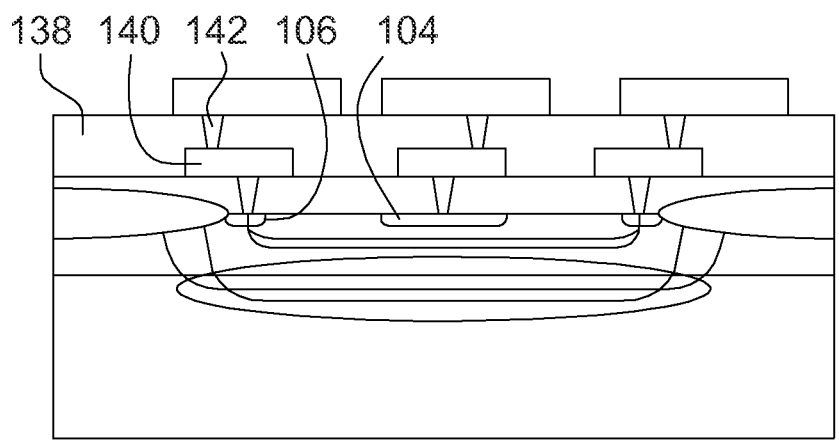

Referring to FIG. 8, an interlayer dielectric layer 138 is formed, and a conductive layer 140 and a conductive plug 142 electrically connected to the second doped region 104 and the third doped region 106 are formed. The conductive layer 140 may be formed by a method comprising depositing a conductive material such as metal on the interlayer dielectric layer 138, and patterning the conductive material. The conductive plug 142 may be formed by a method comprising forming an opening in the interlayer dielectric layer 138, and filling the opening with a conductive material such as metal.

In embodiments, the method for manufacturing the semiconductor structure can be applied for mix-mode or analog circuit design, such as start up circuit or charge pump circuit.

Figure 9:
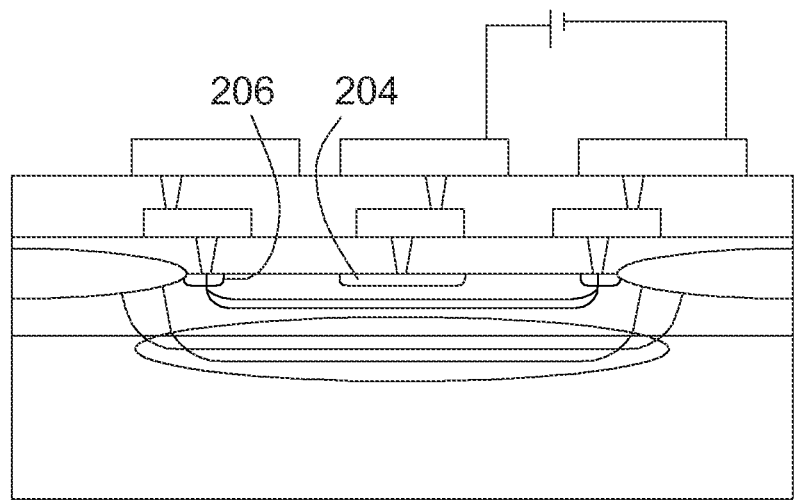
FIG. 9 illustrates a semiconductor structure and an operating method for the same in one embodiment

In one embodiment, a method for operating the diode of the semiconductor structure comprises electrically connecting a cathode to the second doped region 204, and electrically connecting an anode to the third doped region 206, as shown in FIG. 9.

Figure 10:
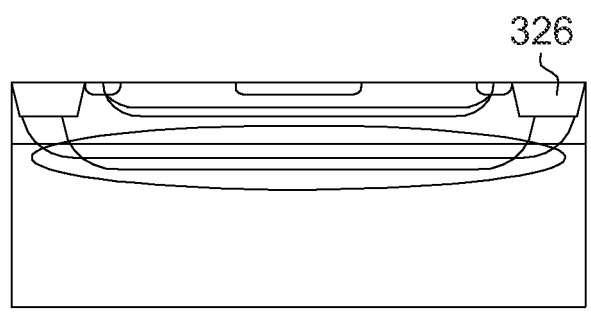
FIG. 10 illustrates a cross-section view of a semiconductor structure in one embodiment.

FIG. 10 illustrates a cross-section view of the semiconductor structure in one embodiment. The semiconductor structure shown in FIG. 10 differs from the semiconductor structure shown in FIG. 1 in that the dielectric isolation structure 326 is STI.

Figure 11:
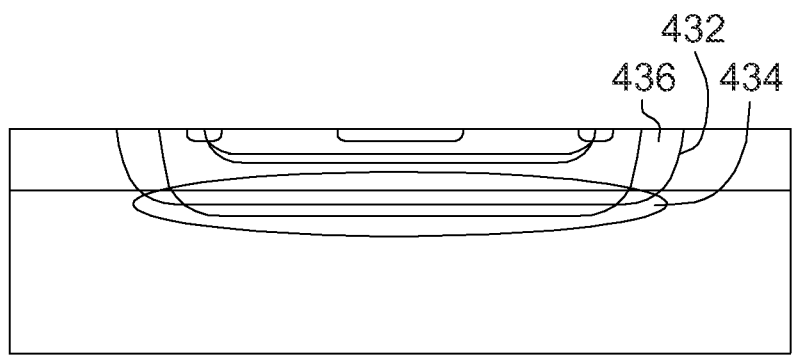
FIG. 11 illustrates a cross-section view of a semiconductor structure in one embodiment.

FIG. 11 illustrates a cross-section view of the semiconductor structure in one embodiment. The semiconductor structure shown in FIG. 11 differs from the semiconductor structure shown in FIG. 1 in that the dielectric isolation structure 26 in FIG. 1 is omitted. In this case, no any dielectric isolation structure is formed. It reduces manufacturing cost. In addition, the active region of the diode is defined by the doped isolation structure 432 comprising the buried layer 434 and the well region 436. Moreover, the diode is isolated from other devices by the doped isolation structure 432 and the buried layer 434.

Figure 12:
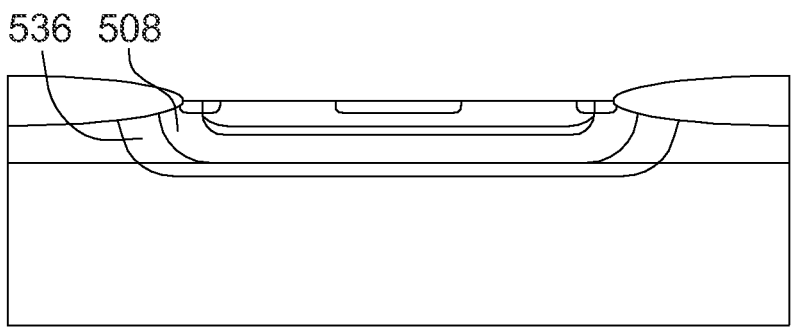
FIG. 12 illustrates a cross-section view of a semiconductor structure in one embodiment.

FIG. 12 illustrates a cross-section view of the semiconductor structure in one embodiment. The semiconductor structure shown in FIG. 12 differs from the semiconductor structure shown in FIG. 1 in that the buried layer 34 in FIG. 1 is omitted. In addition, the well region 508, a depth of which is shallower than a depth of the well region 536, is used. In this case, the diode is isolated from other devices by the well region 536.

Figure 13:
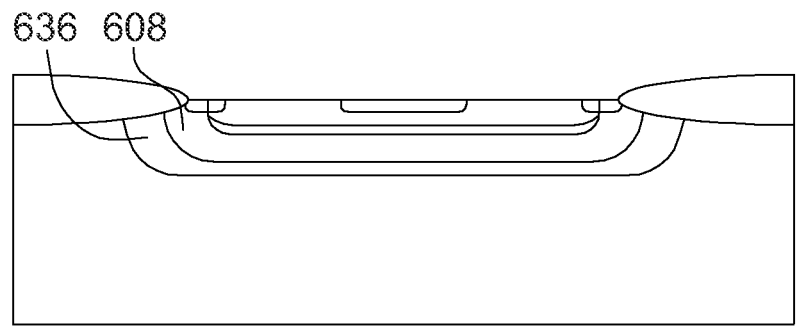
FIG. 13 illustrates a cross-section view of a semiconductor structure in one embodiment.

FIG. 13 illustrates a cross-section view of the semiconductor structure in one embodiment. The semiconductor structure shown in FIG. 13 differs from the semiconductor structure shown in FIG. 1 in that the buried layer 34 and the epitaxial layer 30 in FIG. 1 are omitted. In addition, the well region 608, a depth of which is shallower than a depth of the well region 636, is used. In this case, the diode is isolated from other devices by the well region 636.

Figure 14:
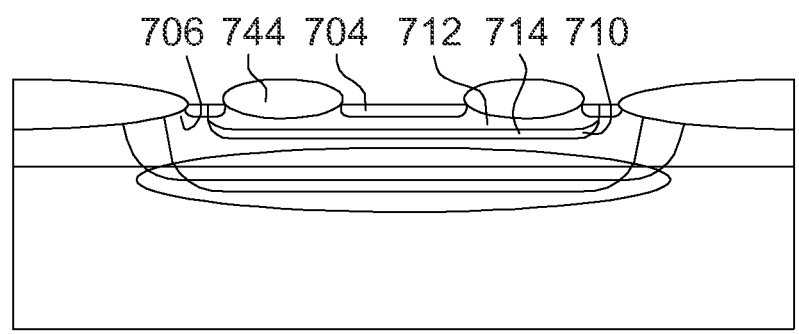
FIG. 14 illustrates a cross-section view of a semiconductor structure in one embodiment.

FIG. 14 illustrates a cross-section view of the semiconductor structure in one embodiment. The semiconductor structure shown in FIG. 14 differs from the semiconductor structure shown in FIG. 1 in that the second doped region 704 and the third doped region 706 are separated from each other by the dielectric isolation structure 744 such as FOX. In other embodiments, the dielectric isolation structure 744 is STI. In one embodiment, the dielectric isolation structure 744 is formed after the top layer 710 comprising the first sub-layer 712 and the second sub-layer 714 is formed. In another embodiment, the dielectric isolation structure 744 is formed after the second sub-layer 714 is formed. The first sub-layer 712 is formed after the dielectric isolation structure 744 is formed. Therefore, a doping path for forming the first sub-layer 712 is passed through the dielectric isolation structure 744. In this case, the Ron of the diode is therefore reduced. In yet another embodiment, the first sub-layer 712 and the second sub-layer 714 are both formed after the dielectric isolation structure 744 is formed. In this case, the Ron of the diode is therefore reduced.

Figure 15:
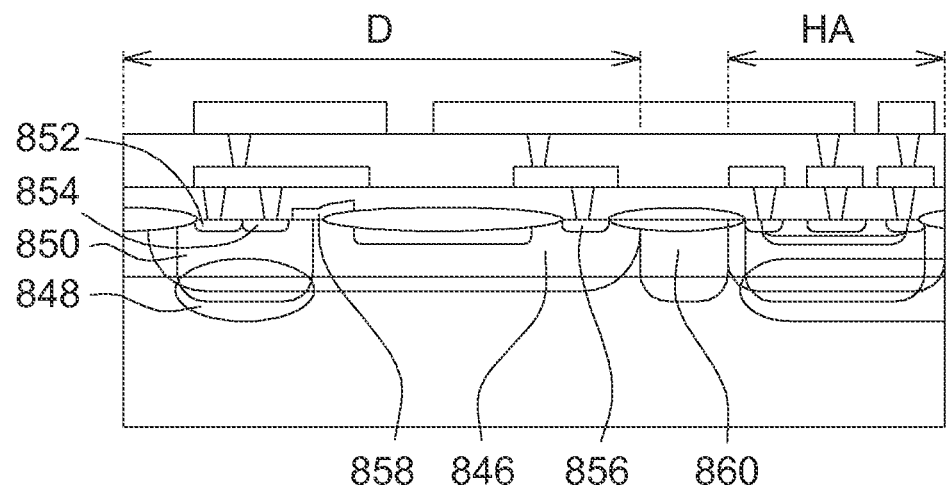
FIG. 15 illustrates a cross-section view of a semiconductor structure in one embodiment.

In embodiments, the diode of the semiconductor structure may be arranged in a high side area of a high voltage integrated circuit (HVIC). For example, in FIG. 15, illustrating a cross-section view of the semiconductor structure in one embodiment, the diode is disposed in the high side area HA adjacent to a device region D. A well region 860 is disposed between the device region D and the high side area HA. The well region 860 may have the first conductivity type such as P conductivity type. A device disposed in the device region D may comprise a MOS. The MOS may comprise a well region 846 such as HV well region, a buried layer 848, a well region 850, a heavily doped region 852, a heavily doped region 854 such as source, a heavily doped region 856 such as drain, and a gate structure 858. The MOS may be NMOS. In one embodiment, the well region 850 and the heavily doped region 852 have the first conductivity type such as P conductivity type. The well region 846, the buried layer 848, the heavily doped region 854 and the heavily doped region 856 have the second conductivity type such as N conductivity type. The heavily doped region 856 such as drain is needed to support a high voltage such as an ultra-high voltage higher than 600V.

In embodiments of the present disclosure, the on-resistance of the diode can be reduced by forming the first sub-layer or the second sub-layer of the top layer after the dielectric isolation structure is formed. The switching speed of the diode can be improved by properly adjusting the doping profile of the top layer. The switching speed of the diode can also be improved by omitting the dielectric isolation structure between the second doped region and the third doped region. In addition, a design area that a unit device need is reduced and manufacturing cost is decreased since the dielectric isolation structure is omitted. The diode can be isolated from other devices by the doped isolation structure.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for manufacturing a semiconductor structure, comprising forming a diode, a method for forming the diode comprising:
   forming a second doped region on a first doped region comprising a well region and a top layer having a dopant concentration bigger than that of the well region; and
   forming a third doped region on the first doped region,
   wherein the first doped region and the third doped region have a first conductivity type, the second doped region has a second conductivity type opposite to the first conductivity type, the second doped region and the third doped region are separated from each other by the first doped region, the third doped region has a first portion formed in the top layer and a second portion formed in the well region which are disposed adjacent to each other, wherein the first portion and the second portion are respectively adjacent to and away from the second doped region; the first portion has a dopant concentration bigger than a dopant concentration of the second portion.

2. The method for manufacturing the semiconductor structure according to claim 1, wherein the method for forming the top layer comprises doping a top portion of the well region.

3. The method for manufacturing the semiconductor structure according to claim 2, wherein a method for forming the third doped region comprises doping a top portion of the top layer and a top portion of the well region adjoined with each other.

4. The method for manufacturing the semiconductor structure according to claim 2, wherein the method for forming the diode comprises forming a dielectric isolation structure on the well region, wherein the second doped region and the third doped region are separated from each other by the dielectric isolation structure, the top layer is formed after forming the dielectric isolation structure.

5. The method for manufacturing the semiconductor structure according to claim 4, further comprising forming a first sub-layer on the well region after forming the dielectric isolation structure.

6. A method for manufacturing a semiconductor structure, comprising forming a diode, a method for forming the diode comprising:
   forming a second doped region on a first doped region comprising a well region and a top layer having a dopant concentration bigger than that of the well region; and
   forming a third doped region on the first doped region,
   wherein the first doped region and the third doped region have a first conductivity type, the second doped region has a second conductivity type opposite to the first conductivity type, the third doped region has a first portion formed in the top layer and a second portion formed in the well region which are disposed adjacent to each other, wherein the second doped region and the third doped region are separated from each other by only the first doped region.

7. The method for manufacturing the semiconductor structure according to claim 6, wherein a method for forming the first doped region comprises doping a top portion of the well region for forming the top layer.

8. The method for manufacturing the semiconductor structure according to claim 7, wherein a method for forming the third doped region comprises doping a top portion of the top layer and a top portion of the well region adjoined with each other so as to form the first portion and the second portion, the first portion and the second portion are respectively adjacent to and away from the second doped region, a dopant concentration of the first portion is bigger than a dopant concentration of the second portion.

9. A method for manufacturing a semiconductor structure, comprising forming a diode, a method for forming the diode comprising:
   forming a second doped region on a first doped region comprising a well region and a top layer having a dopant concentration bigger than that of the well region; and
   forming a third doped region on the first doped region,
   wherein the first doped region and the third doped region have a first conductivity type, the second doped region has a second conductivity type opposite to the first conductivity type, the top layer has a dopant-concentration edge formed by the well region and the top layer and disposed between opposite edges of the third doped region.

10. The method for manufacturing the semiconductor structure according to claim 9, wherein the top layer of first doped region is formed by doping a top portion of the well region, the first doped region further comprises well region.

11. The method for manufacturing the semiconductor structure according to claim 10, wherein a method for forming the third doped region comprises doping a top portion of the top layer and a top portion of the well region adjoined with each other so that the third doped region has a first portion and a second portion adjacent to each other, the first portion and the second portion are respectively adjacent to and away from the second doped region, a dopant concentration of the first portion is bigger than a dopant concentration of the second portion.

\* \* \* \* \*